ism011020999B2

United States Patent
Yoshimoto

(10) Patent No.: US 11,020,999 B2
(45) Date of Patent: Jun. 1, 2021

(54) PHOTOSENSITIVE RESIN COMPOSITION FOR RELIEF PRINTING ORIGINAL PLATE AND RELIEF PRINTING ORIGINAL PLATE USING THE SAME

(71) Applicant: TOYOBO CO., LTD., Osaka (JP)

(72) Inventor: Kazuya Yoshimoto, Okayama (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 16/637,088

(22) PCT Filed: Aug. 3, 2018

(86) PCT No.: PCT/JP2018/029236
§ 371 (c)(1),
(2) Date: Feb. 6, 2020

(87) PCT Pub. No.: WO2019/031406
PCT Pub. Date: Feb. 14, 2019

(65) Prior Publication Data
US 2020/0247169 A1    Aug. 6, 2020

(30) Foreign Application Priority Data

Aug. 7, 2017    (JP) ............................. JP2017-152482
Oct. 20, 2017   (JP) ............................. JP2017-203621

(51) Int. Cl.
*B41N 1/12* (2006.01)
*G03F 7/038* (2006.01)

(52) U.S. Cl.
CPC ............. *B41N 1/12* (2013.01); *G03F 7/0388* (2013.01)

(58) Field of Classification Search
None
See application file for complete search history.

(56) References Cited

U.S. PATENT DOCUMENTS

| 9,678,424 B2 | 6/2017 | Ahura et al. |
| 2001/0044076 A1 | 11/2001 | Hiller et al. |
| 2015/0205201 A1* | 7/2015 | Abura ..................... G03F 7/027 430/280.1 |
| 2015/0367668 A1 | 12/2015 | Kawahara et al. |
| 2017/0225373 A1* | 8/2017 | Mitsutsuji ........... B29C 45/0005 |
| 2018/0236804 A1 | 8/2018 | Yoshimoto et al. |
| 2019/0039397 A1 | 2/2019 | Kawahara et al. |

FOREIGN PATENT DOCUMENTS

| JP | 11-65115 A | 3/1999 |
| JP | 11-170718 A | 6/1999 |
| JP | 2001-272776 A | 10/2001 |
| JP | 2001-328365 A | 11/2001 |
| JP | 2006-2061 A | 1/2006 |
| JP | 2010-58491 A | 3/2010 |
| JP | 2014-142622 A | 8/2014 |
| JP | 2016-163950 A | 9/2016 |
| JP | 2017-49463 A | 3/2017 |
| JP | 2017-129660 A | 7/2017 |
| WO | 2014/021322 A1 | 2/2014 |
| WO | 2014/129243 A1 | 8/2014 |
| WO | 2017/038970 A1 | 3/2017 |
| WO | 2017/056692 A1 | 4/2017 |

OTHER PUBLICATIONS

International Search Report dated Sep. 11, 2018, issued in counterpart International Application No. PCT/JP2018/029236 (1 page).
Notification of Transmittal of Translation of the International Preliminary Report on Patentabililty (Form PCT/IB/338) issued in counterpart International Application No. PCT/JP2018/029236 dated Feb. 20, 2020 with Forms PCT/IB/373 and PCT/ISA/237. (6 pages).

* cited by examiner

*Primary Examiner* — Joshua D Zimmerman
(74) *Attorney, Agent, or Firm* — Westerman, Hattori, Daniels & Adrian, LLP

(57) ABSTRACT

A photosensitive resin composition contains (i) modified partially-saponified polyvinyl acetate having a functional group introduced into a side chain thereof, (ii) tertiary nitrogen atom-containing polyamide, (iii) a photopolymerizable unsaturated compound and (iv) a photopolymerization initiator, characterized in that the above (ii) tertiary nitrogen atom-containing polyamide contains 20 to 50% by mol of a structural unit obtained from cyclohexane-dicarboxylic acid and 50 to 95% by mol of an alicyclic structural unit in total, in relation to a total of an amount of an aminocarboxylic acid unit (including a case wherein lactam is a raw material), an amount of a dicarboxylic acid unit and an amount of a diamine unit in the polyamide molecule. There is also provided a relief printing original plate which is characterized in having, on a support, a photosensitive resin layer formed by using this photosensitive resin composition.

8 Claims, No Drawings

PHOTOSENSITIVE RESIN COMPOSITION FOR RELIEF PRINTING ORIGINAL PLATE AND RELIEF PRINTING ORIGINAL PLATE USING THE SAME

TECHNICAL FIELD OF THE INVENTION

The present invention relates to a photosensitive resin composition for relief printing which contains partially-saponified polyvinyl acetate, and also to a relief printing original plate using the same. More particularly, the present invention relates to a photosensitive resin composition which can provide a printing original plate of an analog type (analog plate) exhibiting a small increase in surface stickiness of a printing plate and thus exhibiting enhanced printing quality while maintaining printing durability; and also can provide a relief printing original plate of a laser-engraving type (a laser-engraving plate) exhibiting enhanced resistance to partial lacking by brushing during removal of resin residues and exhibiting enhanced printing durability during printing and thus exhibiting enhanced printing quality.

BACKGROUND ART

Generally, a photosensitive resin composition used for a relief printing original plate contains a soluble polymer compound, a photopolymerizable unsaturated compound and a photopolymerization initiator as essential components and further contains additives such as a stabilizer and a plasticizer, depending on necessity. A relief printing original plate usually has a structure wherein a photosensitive resin layer formed by using such photosensitive resin composition is formed on a support. As to the relief printing original plate at present, the following three types have been generally known in view of a difference in plate-making process: a relief printing original plate of an analog type (analog plate); a relief printing original plate of a CTP type (CTP plate); and a relief printing original plate of a laser-engraving type (laser-engraving plate).

An analog plate is a type which has been conventionally and widely known. In the analog plate, a relief plate for printing is prepared by the following plate-making steps: a photosensitive resin composition layer is irradiated with an active ray through a negative film (or a positive film) having a transparent image part so as to cure a photosensitive layer of an exposed part and, after that, a photosensitive layer of a non-exposed part is removed by dissolving in an appropriate solvent followed by drying and after-exposing. In many cases, an analog plate requires an original image film made from a silver salt material, and thus it requires time and cost for preparing a negative film (or a positive film).

A CTP (Computer to Plate) plate is a plate which has been developed in accordance with a progress in computer technology. In the CTP plate, information processed on a computer is directly outputted onto an original plate for printing. Accordingly, an original plate for printing is obtained without a need of preparing a negative film (or a positive film).

On the other hand, a laser-engraving plate is a plate which has been developed as a further improvement of a CTP plate. In the laser-engraving plate, a photosensitive resin layer cured by ultraviolet ray is engraved using a laser beam whereby an uneven surface which serves as a relief is formed. Unlike an analog plate wherein a relief image is prepared using a negative film (or a positive film), a laser-engraving plate has such an advantage that a cross-sectional shape of a relief can be freely controlled. Accordingly, a laser-engraving plate is now spreading.

It is common that development of a relief printing original plate is conducted by using water as a solvent. In order to make such a water-development possible, a water-soluble or water-swelling polymer compound is used as a soluble polymer compound for a photosensitive resin layer in any of the original plates.

Partially-saponified polyvinyl acetate is excellent in water-developability. Accordingly, partially-saponified polyvinyl acetate has been used in an analog plate as a soluble polymer compound in a photosensitive resin layer of a relief printing original plate. However, a printing original plate using the partially-saponified polyvinyl acetate has such a problem in terms of image reproducibility that a partial lacking in highlight halftone dots occurs when a hard brush is used in the water-development. In addition, there is a problem in terms of printing durability that, due to brittleness against a printing pressure applied thereto during printing, cracks are easily generated in the relief during a long-run printing whereby it is necessary to replace the printing plate.

In order to solve those problems, there has been proposed an analog plate wherein, polyvinyl acetate derivative and tertiary nitrogen atom-containing polyamide are used together as soluble polymer compounds (see Patent Documents 1 and 2). Although this plate can enhance an anti-cracking property, there is a new problem that a stickiness of a printing plate surface increases due to a stickiness of the polyamide itself.

Further, there has been also proposed an analog plate wherein modified partially-saponified polyvinyl acetate and tertiary nitrogen atom-containing polyamide are used as soluble polymer compounds and, a compound which has a specific 5 to 7-membered ring is used as a photopolymerizable unsaturated compound (see Patent Document 3). Although this plate can further improve the printing durability, the stickiness of the printing plate surface caused by the tertiary nitrogen atom-containing polyamide has been unsolved yet.

Moreover, in a laser-engraving plate, there has been also known plates wherein partially-saponified polyvinyl acetate is used as a soluble polymer compound in the photosensitive resin layer (see Patent Documents 4 to 6).

However, also in a laser-engraving plate, the photosensitive resin composition using partially-saponified polyvinyl acetate and derivatives thereof is inferior in the printing durability which is an indication of resistance to repeated shocks during printing. Accordingly, cracks are generated in a relief during the printing.

As to a method for solving the above problem of printing durability in a laser-engraving plate, Patent Document proposes compounding modified partially-saponified polyvinyl acetate with basic nitrogen-containing polyamide so as to enhance the printing durability. Also, Patent Document proposes further compounding the photosensitive resin composition containing polyvinyl acetate derivative and basic nitrogen-containing polyamide with a photopolymerizable unsaturated compound having a specific heterocyclic ring so as to further enhance the printing durability.

On the other hand, in preparing a laser-engraving plate, resin residues generate during the laser-engraving, and these resin residues adhere onto the printing plate surface. Accordingly, it is necessary to conduct a washing step for removing those resin residues from the printing plate surface. However, in the conventional printing original plate based on the photosensitive resin composition using partially-saponified polyvinyl acetate and derivatives thereof, there is a problem that fine lines and independent dots formed on the printing plate surface are partially lost if the washing step is conducted by a brush whereby image reproducibility becomes bad. Therefore, there is a restriction that a spray method needs to be adopted as a washing method and thus a special device is necessary therefor. Accordingly, there has been a demand for providing a laser-engraving plate which exhibits excellent printing durability during printing and which exhibits small decrease in the image reproducibility even if a washing step for removing the resin residues adhered onto the printing plate surface after the laser-engraving is conducted by a brush.

PRIOR ART DOCUMENTS

Patent Documents

Patent Document 1: Japanese Patent Application Laid-Open (JP-A) No. 65115/99
Patent Document 2: Japanese Patent Application Laid-Open (JP-A) No. 2001-272776
Patent Document 3: WO 2014/021322
Patent Document 4: Japanese Patent Application Laid-Open (JP-A) No. 170718/99
Patent Document 5: Japanese Patent Application Laid-Open (JP-A) No. 2001-328365
Patent Document 6: Japanese Patent Application Laid-Open (JP-A) No. 2010-58491
Patent Document 7: Japanese Patent Application Laid-Open (JP-A) No. 2006-2061
Patent Document 8: WO 2014/129243

DISCLOSURE OF THE INVENTION

Problem that the Invention is to Solve

The present has been created in view of the above-mentioned current status of the relief printing original plate of the above prior art. An object of the present invention is to provide a photosensitive resin composition for a relief printing original plate which solves the above-mentioned problems in the prior art and also to provide a relief printing original plate using the same. More particularly, for an analog plate, an object of the present invention is to provide a photosensitive resin composition for an original plate which exhibits excellent image reproducibility (i.e. no partial lacking in the highlight halftone dots even when a hard brush is used in the development) while maintaining the printing durability and, moreover, which exhibits no increase in the surface stickiness even if a compounding rate of tertiary nitrogen atom-containing polyamide is increased. For a laser-engraving plate, an object of the present invention is to provide a photosensitive resin composition for an original plate which exhibits small decrease in the image reproducibility even when the washing step after the laser-engraving is conducted by a brush while maintaining excellent printing durability during printing.

Means for Solving the Problem

The inventors of the present invention have extensively conducted the investigation for achieving the above objects. As a result, they have found that, by using, in the photosensitive resin composition for relief printing original plate, tertiary nitrogen atom-containing polyamide containing a specific amount of structural unit obtained from cyclohexanedicarboxylic acid and a specific amount of an alicyclic structural unit, in relation to a total of an amount of an aminocarboxylic acid unit (including a case wherein lactam is a raw material), an amount of a dicarboxylic acid unit and an amount of a diamine unit in the polyamide molecule, it is now possible to provide, for an analog plate, a photosensitive resin composition for an original plate which exhibits excellent image reproducibility in terms of the highlight halftone dots without occurring any partial lacking in the development while maintaining the printing durability and, moreover, which exhibits no increase in the stickiness of the printing plate surface even if a compounding rate of tertiary nitrogen atom-containing polyamide is increased, and it is also now possible to provide, for a laser-engraving plate, a photosensitive resin composition for an original plate which exhibits small decrease in the image reproducibility even when the washing step after the laser-engraving is conducted by a brush while maintaining excellent printing durability during printing. As a result, the present invention has now been accomplished.

The present invention has been accomplished on the basis of the above findings and has the constitution of the following (1) to (8).

(1) A photosensitive resin composition for a relief printing original plate containing (i) modified partially-saponified polyvinyl acetate having a functional group introduced into a side chain thereof, (ii) tertiary nitrogen atom-containing polyamide, (iii) a photopolymerizable unsaturated compound and (iv) a photopolymerization initiator, characterized in that the above (ii) tertiary nitrogen atom-containing polyamide contains 20 to 50% by mol of a structural unit obtained from cyclohexane-dicarboxylic acid and 50 to 95% by mol of an alicyclic structural unit in total, in relation to a total of an amount of an aminocarboxylic acid unit (including a case wherein lactam is a raw material), an amount of a dicarboxylic acid unit and an amount of a diamine unit in the polyamide molecule.

(2) The photosensitive resin composition for a relief printing original plate according to (1), wherein an amount of (i) modified partially-saponified polyvinyl acetate having a functional group introduced into a side chain thereof, an amount of (ii) tertiary nitrogen atom-containing polyamide, an amount of (iii) photopolymerizable unsaturated compound and an amount of (iv) photopolymerization initiator used in the photosensitive resin composition for a relief printing original plate are 30 to 65% by mass, 5 to 30% by mass, 5 to 35% by mass and 0.1 to 5% by mass, respectively.

(3) The photosensitive resin composition for a relief printing original plate according to (1) or (2), wherein the above (ii) tertiary nitrogen atom-containing polyamide is a polyamide which contains a piperazine ring in a molecule.

(4) The photosensitive resin composition for a relief printing original plate according to any of (1) to (3), wherein the above (i) modified partially-saponified polyvinyl acetate having a functional group introduced into a side chain thereof contains an ester bond and the functional group in the side chain, and wherein the functional group is a photopolymerizable unsaturated group and/or a carboxyl group.

(5) The photosensitive resin composition for a relief printing original plate according to any of (1) to (4), wherein the above (iii) photopolymerizable unsaturated compound contains a photopolymerizable unsaturated compound containing a heterocyclic ring having a 5 to 7-membered ring.

(6) A relief printing original plate which is characterized in having, on a support, a photosensitive resin layer formed by using the photosensitive resin composition for a relief printing original plate mentioned in any of (1) to (5).

(7) The relief printing original plate according to (6), wherein the relief printing original plate is a relief printing original plate of an analog type.

(8) The relief printing original plate according to (6), wherein the relief printing original plate is a relief printing original plate of a laser-engraving type.

Advantages of the Invention

In accordance with the photosensitive resin composition fora relief printing original plate of the present invention, it is possible to achieve, for an analog plate, high level of image reproducibility in terms of highlight halftone dots while maintaining the printing durability and to prevent increase in stickiness of the printing plate surface even if a compounding rate of tertiary nitrogen atom-containing polyamide is increased; and it is possible to achieve, for a laser-engraving plate, small decrease in the image reproducibility even when the washing step after the laser-engraving is conducted by a brush while maintaining excellent printing durability during printing.

BEST MODE FOR CARRYING OUT THE INVENTION

Hereinafter, the photosensitive resin composition for a relief printing original plate according to the present invention and the relief printing original plate using the same will be explained.

Photosensitive Resin Composition for a Relief Printing Original Plate

The photosensitive resin composition for a relief printing original plate of the present invention contains (i) modified partially-saponified polyvinyl acetate having a functional group introduced into a side chain thereof, (ii) tertiary nitrogen atom-containing polyamide, (iii) a photopolymerizable unsaturated compound and (iv) a photopolymerization initiator. In the present invention, by using tertiary nitrogen atom-containing polyamide containing a specific structural unit in a specific rate, it is possible, in an analog plate, to effectively prevent an increase in stickiness of the printing plate surface (which is a disadvantage in the conventional tertiary nitrogen atom-containing polyamide) while maintaining excellent image reproducibility in terms of the highlight halftone dots and excellent printing durability and, in a laser-engraving plate, it is possible to prepare a laser-engraving plate which exhibits small decrease in the image reproducibility even when the washing step after the laser-engraving is conducted by a brush while maintaining excellent printing durability in the printing.

The (i) modified partially-saponified polyvinyl acetate having a functional group introduced into a side chain thereof (hereinafter, it will be also referred to as a component (i)) is a modified partially-saponified polyvinyl acetate containing a functional group in a side chain thereof. This functional group may be a photopolymerizable unsaturated group and/or a carboxyl group. Here, the photopolymerizable unsaturated group is a functional group which can conduct a cross-linking of a radical reactivity type, and is preferably a (meth)acryloyl group. As to the functional group, each of the photopolymerizable unsaturated group and the carboxyl group may be introduced solely, or both of the photopolymerizable unsaturated group and the carboxyl group may be introduced jointly. As a result of the introduction of the photopolymerizable unsaturated group, resistance to water can be enhanced. In addition, as a result of the introduction of the carboxyl group, compatibility can be enhanced by forming a quaternary salt with a tertiary nitrogen atom-containing polyamide. Moreover, when the functional group has an ester bond, compatibility with (iii) photopolymerizable unsaturated compound can be enhanced whereby photocross linking reaction can be efficiently conducted. Particularly when both of photopolymerizable unsaturated group and carboxylic group are introduced, it is possible to decrease the partial lacking of the relief during development and to enhance compatibility with the tertiary nitrogen atom-containing polyamide.

As to a method for introducing a carboxyl group into the side chain of the modified partially-saponified polyvinyl acetate, there are exemplified a method wherein hydroxyl group in partially-saponified polyvinyl acetate and acid anhydride are reacted whereby a carboxyl group is introduced into the side chain of the polymer, and a method wherein a polymer which has been prepared by copolymerization of vinyl acetate with an unsaturated carboxylic acid (or a salt thereof) or with an unsaturated carboxylate is subjected to a partial saponification whereby a carboxyl group is introduced into the side chain. The modified partially-saponified polyvinyl acetate obtained by those methods contains an ester bond in the side chain thereof, and thus is more preferred in view of the compatibility with (iii) photopolymerizable unsaturated compound. In addition, it is easy to introduce a reactive group into the modified partially-saponified polyvinyl acetate obtained by those methods, resulting in a significant effect of the present invention whereby it is preferred accordingly.

As to a method for introducing a photopolymerizable unsaturated group into the side chain of the modified partially-saponified polyvinyl acetate, there is exemplified a method wherein modified partially-saponified polyvinyl acetate having a carboxyl group introduced into a side chain thereof is used as a start material, and the carboxyl group in the modified partially-saponified polyvinyl acetate is reacted with an epoxy compound containing a photopolymerizable unsaturated group so as to introduce the reactive group thereinto. The modified partially-saponified polyvinyl acetate obtained by this method contains an ester bond in the side chain thereof, and thus is more preferred in view of the compatibility with (iii) photopolymerizable unsaturated compound. In addition, it is easy to introduce a reactive group into the modified partially-saponified polyvinyl acetate obtained by this method, resulting in a significant effect of the present invention whereby it is preferred accordingly.

As to other methods for introducing a photopolymerizable unsaturated group into the modified partially-saponified polyvinyl acetate, there is exemplified a method wherein a reactive group is introduced into the side chain of partially-saponified polyvinyl acetate by reacting the partially-saponified polyvinyl acetate with an acrylic compound having an N-methylol group. A specific preparation condition therefor is that, when 100 parts by mass of the partially-saponified polyvinyl acetate is reacted with 5 to 30 parts by mass of the acrylic compound, it is possible to achieve both of a decrease in the partial lacking of the relief during development and a water-developability, and that is preferred. As to the acrylic compound having an N-methylol group, N-methylol acrylamide and N-methylol methacrylamide are particularly preferred. Each of them may be used solely or two or more there may be used jointly.

An amount of the functional group to be introduced into the side chain of the modified partially-saponified polyvinyl acetate is preferred to be 0.1 to 0.7 mol/kg in the modified partially-saponified polyvinyl acetate. When it is more than 0.7 mol/kg, solubility in water may become bad while, when it is less than 0.1 mol/kg, improving effect may not be achieved.

A degree of saponification of the modified partially-saponified polyvinyl acetate is preferred to be within a range of 60 to 95% by mol and more preferred to be within a range of 70 to 90% by mol. When the degree of saponification is less than the above range, water-developability may lower due to a decrease in hydrophilicity while, when it is more than the above range, water-developability may lower due to too high crystallinity.

An average degree of polymerization of the modified partially-saponified polyvinyl acetate is preferred to be within a range of 200 to 1500 and more preferred to be within a range of 500 to 1000. When the average degree of polymerization is less than the above range, water resistance may become low while, when the average degree of polymerization is higher than the above range, water-developability may lower.

An amount of the component (i) used in the photosensitive resin composition of the present invention is preferred to be 30 to 65% by mass, more preferred to be 35 to 65% by mass, and further preferred to be 40 to 60% by mass. When the amount of the component (i) used therein is less than the above range, shape-retaining property of the photosensitive resin layer may become low and handling property may become inferior while, when it is more than the above range, water-developability may become low.

The above (ii) tertiary nitrogen atom-containing polyamide (hereinafter, it will be also referred to as a component (ii)) contains 20 to 50% by mol of a structural unit obtained from cyclohexane-dicarboxylic acid and 50 to 95% by mol of an alicyclic structural unit in total, in relation to a total of an amount of an aminocarboxylic acid unit (including a case wherein lactam is a raw material), an amount of a dicarboxylic acid unit and an amount of a diamine unit in the polyamide molecule. It is a matter of course that the alicyclic structural unit referred here encompasses the structural unit obtained from cyclohexanedicarboxylic acid.

As mentioned above, the component (ii) used in the present invention contains a specific amount of the structural unit obtained from cyclohexanedicarboxylic acid and a specific amount of the alicyclic structural unit. Therefore, in an analog plate, there are such effects that the problems of the partial lacking of highlight halftone dots during development and of the partial lacking during printing (which are often resulted by compounding of the component (i)) can be solved and further that, even when the compounding amount of the tertiary nitrogen atom-containing polyamide (which is the component (ii)) is increased, an increase in the stickiness of the printing plate surface is small. The conventional tertiary nitrogen atom-containing polyamide is apt to absorb moisture and thus to exhibit high stickiness. Accordingly, it is not possible to increase the adding amount thereof. On the contrary, in accordance with the present invention, it is now possible, in an analog plate, to increase the adding amount of the tertiary nitrogen atom-containing polyamide whereby an effect by compounding with the component (ii) can be enhanced. In a laser-engraving plate, resistance to partial lacking by brushing during removal of the resin residues is excellent in addition to an excellent printing durability during printing.

The component (ii) can be prepared by polymerization of not only an alicyclic dicarboxylic acid including cyclohexanedicarboxylic acid, an alicyclic diamine and a tertiary nitrogen atom-containing diamine but also a monomer such as diamine, dicarboxylic acid, w-amino acid, lactam, etc. as a raw material together with the above.

As explained hereinabove, cyclohexanedicarboxylic acid is used in such an amount wherein a structural unit obtained from cyclohexane-dicarboxylic acid occupies 20 to 50% by mol, in relation to a total of an amount of an aminocarboxylic acid unit (including a case wherein lactam is a raw material), an amount of a dicarboxylic acid unit and an amount of a diamine unit in the polyamide molecule. In the case of an analog plate, the surface stickiness of a printing plate increases when the rate of the structural unit obtained from cyclohexanedicarboxylic acid is less than the above range while, when the rate is more than the above range, an effect of improving the printing durability is small. In the case of a laser-engraving plate, resistance to partial lacking by brushing is inferior when the rate of the structural unit obtained from cyclohexanedicarboxylic acid is less than the above range while, when the rate is more than the above range, an effect of improving the resistance to partial lacking by brushing is small.

Cyclohexanedicarboxylic acid is a dicarboxylic acid which contains a cyclohexane ring. To be more specific, there are exemplified 1,4-cyclohexanedicarboxylic acid, 1,2-cyclohexanedicarboxylic acid, 1,3-cyclohexane-dicarboxylic acid, 2-methyl-1,4-cyclohexanedicarboxylic acid, 2-ethyl-1,4-cyclohexanedicarboxylic acid, 2-propyl-1,4-cyclohexanedicarboxylic acid, 2-butyl-1,4-cyclohexane-dicarboxylic acid, 2-t-butyl-1,4-cyclohexanedicarboxylic acid, 2,3-dimethyl-1,4-cyclohexanedicarboxylic acid, 2,3-diethyl-1,4-cyclohexanedicarboxylic acid, 2,3-dipropyl-1,4-cyclohexanedicarboxylic acid, 2,3-dibutyl-1,4-cyclohexanedicarboxylic acid, 2-methyl-3-ethyl-1,4-cyclohexane-dicarboxylic acid, 2-methyl-3-propyl-1,4-cyclohexane-dicarboxylic acid, 2-methyl-3-butyl-1,4-cyclohexane-dicarboxylic acid, 2-ethyl-3-propyl-1,4-cyclohexane-dicarboxylic acid, 2-ethyl-3-butyl-1,4-cyclohexane-dicarboxylic acid and 2-methyl-3-t-butyl-1,4-cyclohexane-dicarboxylic acid. Among the above, 1,4-cyclohexane-dicarboxylic acid is preferred in view of the reproducibility of gradation printing property of the highlight part.

The component (ii) contains 50 to 95% by mol of an alicyclic structural unit in total, in relation to a total of an amount of an aminocarboxylic acid unit (including a case wherein lactam is a raw material), an amount of a dicarboxylic acid unit and an amount of a diamine unit in the polyamide molecule. An alicyclic structural unit includes a structural unit obtained not only from cyclohexandicarboxylic acid but also from alicyclic dicarboxylic acid and also from alicyclic diamine and alicyclic aminocarboxylic acid to be added thereto upon necessity. When the rate of the total alicyclic structural unit contained therein in the case of an analog plate is less than the above range, it is not possible to increase the compounding amount of the component (ii) due to its inferior compatibility with the component (i) while, when the rate is more than the above range, the printing durability is inferior. When the rate of the total alicyclic structural unit contained therein in the case of a laser-engraving plate is less than the above range, resistance to partial lacking in brushing is inferior while, when the rate is more than the above range, the printing durability is inferior. Incidentally, the term reading "alicyclic diamine" in the present invention shall encompass not only a diamine of saturated and unsaturated cyclic hydrocarbon but also a diamine having a heterocyclic ring such as piperazine.

As to an alicyclic dicarboxylic acid other than the above cyclohexanedicarboxylic acid, there are exemplified isophoronedicarboxylic acid, 2,3-norbornanedicarboxylic acid, 2,6-decalindicarboxylic acid, 3-methyl-2,6-decalindicarboxylic acid, 3-ethyl-2,6-decalindicarboxylic acid, 3-propyl-2,6-decalindicarboxylic acid, 3-butyl-2,6-decalindicarboxylic acid, 3,4-dimethyl-2,6-decalindicarboxylic acid, 3,4-diethyl-2,6-decalindicarboxylic acid, 3,4-dipropyl-2,6-decalindicarboxylic acid, 3,4-dibutyl-2,6-decalindicarboxylic acid, 3,8-dimethyl-2,6-decalindicarboxylic acid, 3,8-diethyl-2,6-decalindicarboxylic acid, 3,8-dipropyl-2,6-decalindicarboxylic acid, 3,8-dibutyl-2,6-decalindicarboxylic acid, 3-methyl-4-ethyl-2,6-decalindicarboxylic acid, 3-methyl-4-propyl-2,6-decalindicarboxylic acid, 3-methyl-4-butyl-2,6-decalindicarboxylic acid and 3-ethyl-4-butyl-2,6-decalindicarboxylic acid.

As to the above alicyclic diamine, there are exemplified isophoronediamine, 1,4-cyclohexanediamine, 1,3-cyclohexane-diamine, 1,3-bis(aminomethyl)cyclohexane, 1,4-bis-(aminomethyl)-cyclohexane, 1-amino-3-aminomethyl-3,5,5-trimethylcyclohexane, bis(4-aminocyclohexyl) methane, bis(3-methyl-4-aminocyclohexyl)methane, 2,2-bis (4-amino-cyclohexyl)propane, 1,4-bis(3-aminopropyl) piperazine, N-(2-aminoethyl)piperazine, methylcyclohexanediamine, norbornanediamine and tricyclodecanediamine. Among the above, isophoronediamine and 1,3-bis(aminomethyl)cyclohexane are preferred in view of the compatibility with the component (i).

As to the above alicyclic aminocarboxylic acid, there are exemplified 4-aminocyclohexanecarboxylic acid, 3-aminocyclohexanecarboxylic acid, 4-(aminomethyl)cyclohexanecarboxylic acid, 3-(aminomethyl)cyclohexanecarboxylic acid and 2-aminomethylcyclopropanecarboxylic acid.

The component (ii) used in the present invention is polyamide which contains a tertiary nitrogen atom in a molecule or, to be more specific, in a part of main chain or side chain. Such polyamide can be prepared by conducting polycondensation reaction, poly-addition reaction, etc., using a monomer having a tertiary nitrogen atom. As to the tertiary nitrogen atom, a piperazine ring or an N,N-dialkylamino group is preferred and a piperazine ring is more preferred. As to a monomer having a tertiary nitrogen atom for preparing the component (ii), there are exemplified diamine having a piperazine ring and aliphatic diamine containing a tertiary nitrogen atom such as methyliminobispropylamine. As to the diamine having a piperazine ring, there are exemplified N,N'-bis(aminoethyl)piperazine, N,N'-bis(3-aminopropyl)-piperazine and N,N'-di(aminopentyl) piperazine. Among the above, N,N'-bis(3-aminopropyl) piperazine is preferred. It is also possible to use an ω-amino acid or the like such as N, N'-dimethyl-N-(aminomethyl)-N'-(carboxymethyl)-ethylene-diamine.

An amount of the component (ii) used in the photosensitive resin composition of the present invention is preferred to be 5 to 30% by mass, and more preferred to be 8 to 25% by mass. In the case of an analog plate, when the amount of the component (ii) used therefor is less than the above range, resistance to partial lacking by brushing, image reproducibility and printing durability may be inferior while, when the amount is more than the above range, a compounding amount of the partially saponified polyvinyl acetate decreases whereby retention property of the original plate shape may be deteriorated. Particularly in the present invention, a problem of an increase in the stickiness of the printing plate surface in an analog plate does not become so significant even when the using amount of the component (ii) in the photosensitive resin composition is increased to be as high as 8% by weight or more. Accordingly, an effect by compounding the component (ii) with the photosensitive resin composition for a relief printing original plate can be further enhanced by means of an increase in the using amount. In the case of a laser-engraving plate, the resistance to partial lacking by brushing and the printing durability may become inferior when the using amount of the component (ii) is less than the above range while, when it is more than the above range, the compounding amount of the partially saponified polyvinyl acetate lowers whereby the retention property of the original plate shape may be deteriorated.

As to (iii) photopolymerizable unsaturated compound (hereinafter, it will be also referred to as a component (iii)), those which have been conventionally used by persons skilled in the art in this technical field may be used. For example, it is preferred to use a photopolymerizable unsaturated compound containing a heterocyclic ring having 5- to 7-membered ring. The photopolymerizable unsaturated compound containing a heterocyclic ring having 5- to 7-membered ring is preferred to have at least a functional group which is hydroxyl group, carboxyl group or amino group in the heterocyclic ring. The heterocyclic ring and the functional group form a hydrogen bond with a hydroxyl group in the component (i) whereby compatibility with the component (i) can be enhanced. Incidentally, molecular weight of the photopolymerizable unsaturated compound containing a heterocyclic ring having 5- to 7-membered ring is preferred to be 300 or less. When the molecular weight becomes high, the compatibility with the component (i) may lower.

As to the component (iii), there may be used, for example, benzyl (meth)acrylate, cyclohexyl (meth)acrylate, phenoxymethyl (meth)acrylate, tetrahydrofurfuryl (meth)acrylate, phenoxydiethylene glycol (meth)acrylate, 2-(meth) acryloyloxyethyl hexahydrophthalic acid, 2-hydroxy-3-phenoxypropyl (meth)acrylate, 2-(meth)acryloyloxyethyl phthalic acid, neopentyl glycol-(meth)acrylate-benzoate, (meth)acryloylmorpholine, styrene and derivatives thereof, vinylpyridine, N-vinyl-2-pyrrolidone, β-(meth)acryloyloxyethyl hydrogen phthalate, N-phenylmaleimide and derivatives thereof, N-(meth)acryloxysuccinic acid imide, 2-naphthyl (meth)acrylate and N-phenyl(meth)acrylamide. Among the above, (meth)acryloyl morpholine is preferred.

An amount of the component (iii) used in the photosensitive resin composition of the present invention is preferred to be 5 to 35% by mass, and more preferred to be 15 to 35% by mass. When the amount of the component (iii) used therefor is less than the above range, reproducibility of the image may be insufficient while, when it is more than the above range, it may be difficult to solidify the photosensitive resin layer used for the relief printing original plate.

The (iv) photopolymerization initiator (hereinafter, it will be also referred to as a component (iv)) has an effect of producing a radical by absorption of light. As to the component (iv), those which have been conventionally known may be used. There are exemplified benzoin alkyl ethers, benzophenones, anthraquinones, benzyls, acetophenones and diacetyls. An amount of the component (iv) used in photosensitive resin composition of the present invention is preferred to be 0.1 to 5% by mass.

The photosensitive resin composition of the present invention may be further compounded with an optional component such as a plasticizer or a polymerization inhibitor. A plasticizer is used for enhancing flexibility. Specific examples thereof are polyhydric alcohols such as ethylene glycol, diethylene glycol, triethylene glycol, glycerol and derivatives thereof, trimethylolpropane and derivatives thereof, trimethylolethane and derivatives thereof, and pentaerythritol and derivatives thereof. An amount of the plasticizer as such used therefor is preferred to be 20% by mass or less of the total mass of the photosensitive resin composition of the present invention. The polymerization inhibitor is used for enhancing thermostability. Specific examples thereof are phenols, hydroquinones, catechols and hydroxylamine derivatives. An amount of the polymerization inhibitor as such used therefor is preferred to be from 0.001% by mass to 5% by mass of the total mass of the photosensitive resin composition of the present invention.

It is also possible to further compound an optional component such as dye, pigment, surfactant, antifoaming agent, ultraviolet absorber or fragrance in a rate of up to 10% by mass to the total mass of the photosensitive resin composition.

Relief Printing Original Plate

The relief printing original plate of the present invention can be prepared by appropriately mixing the above essential components (i), (ii), (iii) and (iv) and optional components so as to prepare the photosensitive resin composition, and subjecting the resulting photosensitive resin composition to a melt molding or other known methods (such as thermal pressing, casting, melt extrusion and solution casting) so as to obtain an aimed laminate.

In the relief printing original plate, a molded product (a photosensitive resin layer or a non-exposed resin) having a sheet form is laminated onto a support with or without an aid of a known adhesive. As to the support, there may be used a conventionally known one such as steel, aluminum, glass or plastic film (such as polyester film). Usually, a film in a thickness of within a range of 50 to 500 µm is used. When the molded product having a sheet form (the photosensitive resin layer or the non-exposed resin) is laminated on a support and the resulting laminate is supplied, it is preferred to further laminate a protective film so as to contact with the molded product having a sheet form (the photosensitive resin layer or the non-exposed resin). As to the protective film, a plastic in a filmy shape can be used. For example, a polyester film in 125 µm thickness is used. It is also possible to arrange, between the photosensitive resin layer and the protective film, an adhesion-preventing layer which is formed by applying a non-viscous transparent polymer being dispersible or soluble in a development solution in a thickness of 0.5 to 3 µm. As a result of forming the adhesion-preventing layer on a surface of the photosensitive resin layer, peeling-off of the protective layer in the next exposing operation can be easily done even if the surface stickiness is strong.

In the relief printing original plate of the present invention, a cap layer in a thickness of 1 to 30 µm may be formed between the photosensitive resin layer and the adhesion-preventing layer. The cap layer is not removed in the development step but remains on the printing plate. Accordingly, it is now possible to adjust the surface characteristics of the printing plate and the durability. As to the cap layer, the conventionally known cap layer may be used just as it is.

Now, a method for making the relief printing plate from the relief printing original plate will be explained. Firstly, in the case of an analog plate, a negative film having a transparent image part is tightly adhered to the photosensitive resin layer and the resulting laminate is irradiated with active ray from an upper side for exposure so as to prepare an original plate wherein only an exposed part through which the active ray has been transmitted is made insoluble. As to a light source for the active ray, there is used a high-voltage mercury lamp, an ultrahigh-voltage mercury lamp, a metal halide lamp, a xenon lamp or a chemical lamp etc. wherein the main wavelength is usually 300 to 450 nm. After that, a non-exposed part is removed by dissolving in an appropriate solvent or, particularly in the present invention, in neutral water. It is preferred to dissolve and remove the non-exposed part by using a development means such as a spray development device or a brush-type development device. After that, the printing plate wherein the non-exposed part is dissolved and removed is subjected to steps of straining, drying and after-exposing to light whereupon the final printing plate is prepared.

In the case of a laser-engraving plate, the whole area of the photosensitive resin layer in the resulting printing original plate is firstly irradiated with ultraviolet so as to cross-link and cure. A condition for the ultraviolet irradiation is not particularly limited. For example, the photosensitive resin layer can be exposed for 5 to 15 minutes from a surface thereof by an ultraviolet exposure device at about 8 mW/cm$^2$ (light source: 10R manufactured by Philips). After that, the printing original plate is attached onto a surface of a plate-attaching drum of a laser-engraving device, and subjected to an image-wise laser beam irradiation whereby an irradiated part in the original plate is decomposed so as to form a concave part. As a result, an image is formed and a printing plate is prepared. Incidentally, during the course of this laser beam irradiation (laser-engraving), resin residues are generated and adhered onto the printing plate surface. Therefore, the printing plate is washed to remove the resin residues from the printing plate surface. It is not necessary to use a special device for washing the printing plate. Instead, the washing may be conducted using a brush. In the conventional laser-engraving plate, fine lines and independent dots formed on the printing plate surface are partially lost if the washing is conducted by a brush whereby the image reproducibility becomes bad. Therefore, it has been necessary to adopt a spraying method and a special device has been demanded therefor. On the contrary, such a problem does not occur in the laser-engraving plate of the present invention. The washing can be conducted simply and easily by using a brush which is less expensive.

EXAMPLES

Hereinafter, the present invention will now be illustrated in more detail by way of (A) Examples for analog plates and (B) Examples for laser-engraving plates although the present invention shall not be limited thereto.

(A) Examples for Analog Plates

The part numbers in Examples (in the text) stand for part(s) by mass. The composition of the polyamide shown in Table 1 is expressed by "% by mol". The "% by mol" of the polyamide composition was determined by an H-NMR measurement. Evaluation of the characteristic values in Examples was done in accordance with the following methods.

(1) Resistance to Partial Lacking by Brushing for Fine Lines of 30 µm

Firstly, a relief printing original plate wherein a thickness of a photosensitive resin layer was 685 µm was exposed for 8 minutes from a position which is at a distance of 5 cm height from a surface of the photosensitive resin layer, using a negative film having fine lines of 30 μm as an image and using a chemical lamp wherein the illuminance was adjusted to 25 W/m². After that, the plate was developed with tap water of 25° C. by a brush-type washer (type JW-A2-PD manufactured by Nippon Denki Seiko) using several nylon brushes having different diameters whereupon a relief image was obtained. Then, the plate was dried with hot wind of 60° C. for 10 minutes, and exposed with an ultrahigh pressure mercury lamp for 30 seconds to give a printing plate. Reproducibility of the fine lines of 30 μm was observed under a microscope of 50 magnifications. The resistance to partial lacking by brushing for fine lines of 30 μm was evaluated according to the following standards.

oo: No lacking in the fine lines when a brush having a diameter of 200 μm was used.

o: No lacking in the fine lines when a brush having a diameter of 150 μm was used.

Δ: No lacking in the fine lines when a brush having a diameter of 120 μm was used.

x: Lacking in the fine lines was noted even when a brush having a diameter of 120 μm was used.

(2) Stickiness of Printing Plate Surface

Firstly, a relief printing original plate wherein a thickness of a photosensitive resin layer was 685 μm was exposed for 8 minutes from a position which is at a distance of 5 cm height from a surface of the photosensitive resin layer, using a negative film for printing evaluation having a solid image (1 cm in width×5 cm in length) as an image and using a chemical lamp wherein the illuminance was adjusted to 25 W/m². After that, the plate was developed with tap water of 25° C. by a brush-type washer (120 μm φ nylon brush, type JW-A2-PD manufactured by Nippon Denki Seiko) whereupon a relief image was obtained. Then, the plate was dried with hot wind of 60° C. for 10 minutes, and exposed with an ultrahigh pressure mercury lamp for 30 seconds to give a printing plate. Stickiness of the printing plate surface was evaluated using the resulting printing plate. A coated paper (Gloss PW-8K manufactured by Lintek Corporation) (which was a paper to be printed) was pushed onto the plate. The stickiness was evaluated from a sliding degree of the coated paper according to the following standards.

oo: Even when the coated paper was pushed onto the plate for 100 times or more, the coated paper slid without resistance.

o: Although the coated paper slid without resistance, some resistances were noted when the coated paper was pushed onto the plate for 100 times or more.

Δ: When the coated paper was pushed onto the plate, the plate immediately sticked to the coated paper. However, when force was applied, the coated paper slid.

x: When the coated paper was pushed onto the plate, the plate completely sticked to the coated paper and thus the coated paper did not slide.

(3) Image Reproducibility

Firstly, a relief printing original plate wherein a thickness of a photosensitive resin layer was 685 μm was exposed for 8 minutes from a position which is at a distance of 5 cm height from a surface of the photosensitive resin layer, using a negative film having halftone dots with 200 lines 1% as an image and using a chemical lamp wherein the illuminance was adjusted to 25 W/m². After that, the plate was developed with tap water of 25° C. by a brush-type washer (type JW-A2-PD manufactured by Nippon Denki Seiko) using several nylon brushes having different diameters whereupon a relief image was obtained. Then, the plate was dried with hot wind of 60° C. for 10 minutes, and exposed with an ultrahigh pressure mercury lamp for 30 seconds to give a printing plate. The reproducibility of the halftone dots with 200 lines 1% were observed under a microscope of 50 magnifications. The image reproducibility was evaluated according to the following standards.

oo: When a brush having a diameter of 200 μm was used, the 1% halftone dots with 200 lines were completely reproduced.

o: When a brush having a diameter of 150 μm was used, the 1% halftone dots with 200 lines were completely reproduced.

Δ: When a brush having a diameter of 120 μm was used, the 1% halftone dots with 200 lines were completely reproduced.

x: Even when a brush having a diameter of 120 μm was used, the 1% halftone dots with 200 lines were not reproduced.

(4) Printing Durability

A printing plate was prepared by the same method as in the preparation of a relief for the evaluation of stickiness of the printing plate surface in the above (2). Printing for 10,000 shots was conducted under such a state wherein an applied pressure corresponds to an extent of 50 μm over compared with an appropriate printing pressure. After finishing the printing for 10,000 shots, the printed matter and the plate were observed under a microscope of 200 magnifications so as to evaluate the printing durability according to the following judging standards.

oo: In the observation under the microscope of 200 magnifications, no defect was noticed in the printed matter and no crack was noticed in the plate as well.

o: In the observation under the microscope of 200 magnifications, no defect was noticed in the printed matter although slight cracks were noticed in the plate.

Δ: In the printed matter and the plate, no defect was noticed by the naked eye. However, in the observation under the microscope of 200 magnifications, poor quality was noticed in the printed matter or the plate.

x: Poor quality was noticed by the naked eye in the printed matter or the plate.

Synthesis of (i) Modified Partially-Saponified Polyvinyl Acetate Having a Functional Group Introduced Into Side Chain Thereof Synthetic Example Ai-1

Partially saponified polyvinyl acetate manufactured by Nippon Synthetic Chemical Industry ("KL-05"; degree of polymerization: ca. 500; degree of saponification: 80% by mol) was swollen in acetone, and 1.0% by mol of succinic anhydride was added thereto followed by stirring at 60° C. for 6 hours so as to add carboxyl group to a molecular chain. This polymer was washed with acetone so as to remove unreacted succinic anhydride, and dried. This polymer (100 parts) was dissolved in 200 parts of a mixed solvent of ethanol/water (30/70 in a ratio by mass) at 80° C. Glycidyl methacrylate (6 parts) was added thereto so as to introduce a reactive group into the partially saponified polyvinyl acetate. From an analytical result by pontentiometric titration, it was confirmed that the carboxyl group in the polymer reacted with epoxy group in glycidyl methacrylate and that methacryloyl group was introduced into the polymer side chain. In this way, there was obtained a modified partially-saponified polyvinyl acetate Ai-1 having a functional group introduced into the side chain thereof (i.e. the component (i)).

Synthetic Example Ai-2

A polymer wherein methacrylic acid was contained in vinyl acetate in an amount of 1% by mol as a copolymerizing unit was saponified to give an anion-modified polyvinyl acetate having average degree of polymerization of 650 and degree of saponification of 75% by mol. This polymer (100 parts) was dissolved in 200 parts of a mixed solvent of ethanol/water (30/70 in a ratio by mass) at 80° C. Glycidyl methacrylate (6 parts) was added thereto so as to introduce a reactive group into the partially saponified polyvinyl acetate. From an analytical result by pontentiometric titration, it was confirmed that the carboxyl group in the polymer reacted with epoxy group in glycidyl methacrylate and that methacryloyl group was introduced into the polymer side chain. In this way, there was obtained a modified partially-saponified polyvinyl acetate Ai-2 having a functional group introduced into the side chain thereof (i.e. the component (i)).

Synthetic Example Ai-3

Partially saponified polyvinyl acetate manufactured by Nippon Synthetic Chemical Industry ("KL-05"; degree of polymerization: ca. 500; degree of saponification: 80% by mol) (100 parts) was dissolved in 100 parts of water, 15 parts of N-methylol acrylamide was added thereto, 1 part of phosphoric acid was added thereto as an acid catalyst. The resulting mixture was stirred at 100° C. for four hours, and then water was removed therefrom. In this way, there was obtained a modified partially-saponified polyvinyl acetate Ai-3 having a functional group introduced into the side chain thereof (i.e. the component (i)).

Synthesis of (ii) Tertiary Nitrogen Atom-Containing Polyamide

Synthetic Example Aii-1

ε-Caprolactam (521 parts (46.0% by mol)), 458 parts (26.6% by mol) of cyclohexanedicarboxylic acid, 549 parts (27.4% by mol) of 1,4-bis(3-aminopropyl)piperazine, 5 parts of 50% aqueous solution of hypophosphorous acid and 3000 parts of water were charged into an autoclave. After substituting with nitrogen, the autoclave was tightly closed and gradually heated. Starting from a stage when an inner pressure reached 0.4 MPa, water was evaporated therefrom until the pressure could no longer be maintained. The pressure was returned to atmospheric within about 2 hours. Then, a reaction was conducted at an atmospheric pressure for 1 hour. The highest temperature for the polymerization reaction was 255° C. As a result, there was obtained a tertiary nitrogen atom-containing polyamide Aii-1 (i.e. the component (ii)). Composition of the resulting tertiary nitrogen atom-containing polyamide was measured by H-NMR, and it was confirmed that there was no difference between the charged composition and the polymer composition. Composition of this tertiary nitrogen atom-containing polyamide Aii-1 and rates of the structural unit obtained from cyclohexanedicarboxylic acid and of alicyclic structural unit in the polyamide are shown in Table 1.

Synthetic Examples Aii-2 to Aii-8

Synthesis was conducted by the same method as in the case of Synthetic Example Aii-1 except that the types and the compounding rates of diamine and dicarboxylic acid and also the compounding rate of ε-caprolactam were changed so as to result in the polyamide composition mentioned in Table 1. As a result, there was obtained tertiary nitrogen atom-containing polyamides Aii-2 to Aii-8 (i.e. the component (ii)). Composition of the resulting tertiary nitrogen atom-containing polyamide was measured by H-NMR, and it was confirmed that there was no difference between the charged composition and the polymer composition. Compositions of these tertiary nitrogen atom-containing polyamides Aii-2 to Aii-8 and rates of the structural unit obtained from cyclohexanedicarboxylic acid and of alicyclic structural unit in the polyamides are shown in Table 1.

TABLE 1

| Tertiary nitrogen atom-containing polyamide | | | Aii-1 | Aii-2 | Aii-3 | Aii-4 | Aii-5 | Aii-6 | Aii-7 | Aii-8 |
|---|---|---|---|---|---|---|---|---|---|---|
| Polyamide composition (% by mol) | diamine | BAPP | 27.4 | 38.4 | 34.4 | | 30.4 | 39.8 | 34.3 | 34.4 |
| | | AEP | | | | 38.4 | | | | 11.0 |
| | | IPDA | | | 10.0 | | | | | 20.5 |
| | | HMDA | | | 3.0 | | | | | |
| | dicarboxylic acid | adipic acid | | | | | 29.6 | | | |
| | | CHDA | 26.6 | 37.6 | 46.6 | 37.6 | | 15.2 | 56.4 | 34.1 |
| | ε-caprolactam | | 46.0 | 24.0 | 6.0 | 24.0 | 40.0 | 45.0 | 9.3 | 0.0 |
| Structural unit obtained from cyclohexanedicarboxylic acid in polyamide (% by mol) | | | 26.6 | 37.6 | 46.6 | 37.6 | 0.0 | 15.2 | 56.4 | 34.1 |
| Alicyclic structural unit in polyamide (% by mol) | | | 54.0 | 76.0 | 91.0 | 76.0 | 30.4 | 55.0 | 90.7 | 100.0 |

BAPP: 1,4-bis(3-aminopropyl)piperazine
AEP: N-(2-aminoethyl)piperazine
IPDA: isophoronediamine
HMDA: hexamethylenediamine
CHDA: 1,4-cyclohexanedicarboxylic acid

Example A1

The component (i) and the component (ii) shown in Table 2 were added into a three-necked flask equipped with a spatula for stirring and a cooling jacket, and mixed with a mixed solvent consisting of 50 parts of "Solmix" (registered trademark) H-11 (an alcohol mixture manufactured by Japan Alcohol Corporation) and 50 parts of water. The resulting mixture was heated at 90° C. for 2 hours with stirring so as to dissolve the component (i) and the component (ii). After cooling down to 70° C., other components were added followed by stirring for 30 minutes so as to give a photosensitive resin composition.

After that, a support having an adhesive layer was prepared. The support having an adhesive layer was prepared by coating an adhesive composition containing an ultraviolet ray-absorbing material on a polyester film of 250 μm thickness, in a coat thickness of 20 μm. The above photosensitive resin composition was subjected to a flow casting on a surface of the adhesive layer of this support. A polyester film of 125 μm thickness coated with a coat of polyvinyl alcohol in 2 μm thickness (AH-26 manufactured by Nippon Synthetic Chemical Industry) was laminated, using a laminator, on the photosensitive resin composition in such a manner that a coated side of the polyester film contacts with the photosensitive resin composition whereby a crude plate of a sheet-shaped laminate having a total thickness of 1080 μm was molded.

After the crude plate was stored for 7 days or more, its printing plate characteristic and printing durability were evaluated. Result of those evaluations is shown in Table 2 together with the compositions of the photosensitive resin compositions of Example A1.

Examples A2 to A13 and Comparative Examples A1 to A6

Photosensitive resin compositions were prepared by the same manner as in Example A1 except that the compositions of the photosensitive resin compositions were changed to those mentioned in Table 2 whereupon printing original plates were obtained. The resulting printing plates were subjected to the same evaluations as in Example A1. Result of those evaluations is shown in Table 2 together with the compositions of the photosensitive resin compositions of Examples A2 to A13 and Comparative Examples A1 to A6.

Details of (iii) photopolymerizable unsaturated compounds (Aiii-1 to Aiii-5), (iv) photopolymerization initiator, plasticizer and thermal polymerization inhibitor mentioned in Table 2 are as follows.

Aiii-1: 4-Acryloylmorpholione (manufactured by KJ Chemicals)

Aiii-2: 2-Acryloyloxyethylphthalic acid (HOA-MPL(N) manufactured by Kyoeisha Chemical)

Aiii-3: Glycerol dimethacrylate (manufactured by Kyoeisha Chemical)

Aiii-4: 2-Hydroxy-3-acryloyloxypropyl methacrylate (NK Ester 701A manufactured by Shin-Nakamura Chemical)

Aiii-5: Propylene glycol diepoxyacrylate (Epoxy Ester 70PA manufactured by Kyoeisha Chemical)

Photopolymerization initiator: Benzyl dimethylketal

Plasticizer: Diethylene glycol

Thermal polymerization inhibitor: Hydroquinone monomethyl ether

TABLE 2

| | | | Example A1 | Example A2 | Example A3 | Example A4 | Example A5 | Example A6 | Example A7 |
|---|---|---|---|---|---|---|---|---|---|
| Compositions of photosensitive resin composition (part by mass) | (i) modified partially-saponified polyvinyl acetate having a functional group introduced into side chain thereof | Ai-1 | 53 | 53 | 53 | 53 | 53 | 53 | 53.5 |
| | | Ai-2 | | | | | | | |
| | | Ai-3 | | | | | | | |
| | (ii) tertiary nitrogen atom-containing polyamide | Aii-1 | 10 | | | | | | |
| | | Aii-2 | | 10 | | | | | 7.5 |
| | | Aii-3 | | | 10 | | | | |
| | | Aii-4 | | | | 10 | | | |
| | tertiary nitrogen atom-containing polyamide other than (ii) | Aii-5 | | | | | 10 | | |
| | | Aii-6 | | | | | | 10 | |
| | | Aii-7 | | | | | | | |
| | | Aii-8 | | | | | | | |
| | (iii) photopolymerizable unsaturated compound | Aiii-1 | 12 | 12 | 12 | 12 | | 12 | 14 |
| | | Aiii-2 | | | | | | | |
| | | Aiii-3 | | | | | 12 | | |
| | | Aiii-4 | 10.8 | 10.8 | 10.8 | 10.8 | 10.8 | 10.8 | 10.8 |
| | | Aiii-5 | 5 | 5 | 5 | 5 | 5 | 5 | 5 |
| | (iv) photopolymerization initiator | | 1 | 1 | 1 | 1 | 1 | 1 | 1 |
| | thermal polymerization inhibitor | | 8 | 8 | 8 | 8 | 8 | 8 | 8 |
| | plasticizer | | 0.2 | 0.2 | 0.2 | 0.2 | 0.2 | 0.2 | 0.2 |
| Result of evaluations | printing plate characteristic | resistance to partial lacking by brushing for fine lines of 30 μm | ○ | ○ | ○ | ○ | ○ | ○ | △ |
| | | stickiness of the printing plate surface | ○○ | ○○ | ○○ | ○○ | ○○ | ○○ | ○○ |
| | | image reproducibility for 200 lines 1% | ○ | ○ | ○ | ○ | ○ | ○ | ○ |
| | printing durability | | ○○ | ○○ | ○○ | ○○ | ○○ | ○○ | ○○ |

| | | | Example A8 | Example A9 | Example A10 | Example A11 | Example A12 | Example A13 |
|---|---|---|---|---|---|---|---|---|
| Compositions of photosensitive resin composition (part by mass) | (i) modified partially-saponified polyvinyl acetate having a functional group introduced into side chain thereof | Ai-1 | 50 | 46 | | | 55.5 | 46 |
| | | Ai-2 | | | 53 | | | |
| | | Ai-3 | | | | 53 | | |
| | (ii) tertiary nitrogen atom-containing polyamide | Aii-1 | 13 | 17 | 10 | 10 | 7.5 | 17 |
| | | Aii-2 | | | | | | |
| | | Aii-3 | | | | | | |
| | | Aii-4 | | | | | | |
| | tertiary nitrogen atom-containing polyamide other than (ii) | Aii-5 | | | | | | |
| | | Aii-6 | | | | | | |
| | | Aii-7 | | | | | | |
| | | Aii-8 | | | | | | |
| | (iii) photopolymerizable unsaturated compound | Aiii-1 | 12 | 12 | 12 | 12 | 12 | 12 |
| | | Aiii-2 | | | | | | |
| | | Aiii-3 | | | | | | |
| | | Aiii-4 | 10.8 | 10.8 | 10.8 | 10.8 | 10.8 | 10.8 |

TABLE 2-continued

| | | | Comparative Example A1 | Comparative Example A2 | Comparative Example A3 | Comparative Example A4 | Comparative Example A5 | Comparative Example A6 |
|---|---|---|---|---|---|---|---|---|
| | | Aiii-5 | 5 | 5 | 5 | 5 | 5 | 5 |
| | (iv) photopolymerization initiator | | 1 | 1 | 1 | 1 | 1 | 1 |
| | plasticizer | | 8 | 8 | 8 | 8 | 8 | 8 |
| | thermal polymerization inhibitor | | 0.2 | 0.2 | 0.2 | 0.2 | 0.2 | 0.2 |
| Result of evaluations | printing plate characteristic | resistance to partial lacking by brushing for fine lines of 30 μm | ○ | ○ | ○ | ○ | ○ | △ |
| | | stickiness of the printing plate surface | ⊙⊙ | ⊙⊙ | ⊙⊙ | ⊙⊙ | ⊙⊙ | ⊙⊙ |
| | | image reproducibility for 200 lines 1% | ○ | ○ | ○ | ○ | ○ | ○ |
| | printing durability | | ⊙⊙ | ⊙⊙ | ⊙⊙ | ⊙⊙ | ⊙⊙ | ⊙⊙ |

| | | | Comparative Example A1 | Comparative Example A2 | Comparative Example A3 | Comparative Example A4 | Comparative Example A5 | Comparative Example A6 |
|---|---|---|---|---|---|---|---|---|
| Compositions of photosensitive resin composition (part by mass) | (i) modified partially-saponified polyvinyl acetate having a functional group introduced into side chain thereof | Ai-1 | 61 | 55.5 | 46 | 53 | 53 | 53 |
| | | Ai-2 | | | | | | |
| | | Ai-3 | | | | | | |
| | (ii) tertiary nitrogen atom-containing polyamide | Aii-1 | | | | | | |
| | | Aii-2 | | | | | | |
| | | Aii-3 | | | | | | |
| | | Aii-4 | | | | | | |
| | | Aii-5 | | 7.5 | | | | |
| | tertiary nitrogen atom-containing polyamide other than (ii) | Aii-6 | | | 17 | | | |
| | | Aii-7 | | | | 10 | | |
| | | Aii-8 | | | | | 10 | |
| | (iii) photopolymerizable unsaturated compound | Aiii-1 | 14 | 12 | 12 | 12 | 12 | 12 |
| | | Aiii-2 | | | | | | 10 |
| | | Aiii-3 | | | | | | |
| | | Aiii-4 | 10.8 | 10.8 | 10.8 | 10.8 | 10.8 | 10.8 |
| | | Aiii-5 | 5 | 5 | 5 | 5 | 5 | 5 |
| | (iv) photopolymerization initiator | | 1 | 1 | 1 | 1 | 1 | 1 |
| | plasticizer | | 8 | 8 | 8 | 8 | 8 | 8 |
| | thermal polymerization inhibitor | | 0.2 | 0.2 | 0.2 | 0.2 | 0.2 | 0.2 |
| Result of evaluations | printing plate characteristic | resistance to partial lacking by brushing for fine lines of 30 μm | x | △ | x | △ | △ | △ |
| | | stickiness of the printing plate surface | ⊙⊙ | ○ | △ | ○ | ○ | ○ |
| | | image reproducibility for 200 lines 1% | x | ○ | ○ | ○ | ○ | △ |
| | printing durability | | x | | | | | |

As will be noticed from Table 2, in Examples A1 to A13, a tertiary nitrogen atom-containing polyamide containing a structural unit obtained from cyclohexanedicarboxylic acid and an alicyclic structural unit within a range of the present invention (20 to 50% by mol and 50 to 95% by mol, respectively) is used as a tertiary nitrogen atom-containing polyamide. Therefore, in Examples A1 to A13, the products are excellent in all terms of the resistance to partial lacking by brushing, the stickiness of a printing plate surface, the image reproducibility and the printing durability. On the contrary, the resistance to partial lacking by brushing, the image reproducibility and the printing durability are inferior when no tertiary nitrogen atom-containing polyamide is contained therein as shown in Comparative Example A1. As shown in Comparative Examples A2 and A3, when a tertiary nitrogen atom-containing polyamide which does not contain any structural unit obtained from cyclohexanedicarboxylic acid is used, the stickiness of the printing plate surface is inferior. A degree thereof increases as the containing rate of such tertiary nitrogen atom-containing polyamide increases. In addition, the resistance to partial lacking by brushing and the image reproducibility are inferior as well. As shown in Comparative Example A4, even if the structural unit obtained from cyclohexanedicarboxylic acid is contained therein, the resistance to partial lacking by brushing and the stickiness of printing surface are inferior when a content of the unit is too small. As shown in Comparative Example A5, even if the structural unit obtained from cyclohexanedicarboxylic acid is contained therein, the printing durability is inferior when the content of the unit is too large. As shown in Comparative Example A6, even if the structural unit obtained from cyclohexanedicarboxylic acid is contained therein in an amount within the range of the present invention, the printing durability is inferior when a total amount of the alicyclic structural unit is too large.

(B) Examples for Laser-Engraving Plate

The part numbers in Examples (in the text) stand for part(s) by mass. The composition of the polyamide shown in Table 3 is expressed by "% by mol". The "% by mol" of the polyamide composition was determined by an H-NMR measurement. Evaluation of the characteristic values in Examples was done in accordance with the following methods.

(1) Resistance to Partial Lacking by Brushing (For Fine Lines of 30 μm Width and for Independent Points of 100 μm Diameter)

A laser-engraved plate was dipped in a rinsing water and fine lines of 30 μm width and independent points of 100 μm diameter in the engraved part were rubbed by brushing for ten times with a brush in a size of 10 cm×5 cm. The brush used was made of nylon in which each brush was in 150 μm diameter and was implanted in a staggered manner with an implanted length of 15 mm. After that, the printing plate obtained by drying was observed by enlarging to an extent of 200 fold under a microscope. The resistance to partial lacking by brushing was evaluated according to the following standards.

oo: No lacking was generated.

o: In a part of the image, fine lacking was generated.

Δ: In a part of the image, lacking was generated.

x: Lacking was generated in whole surface of the image.

(2) Printing Durability (Cracking of the Solid Part)

Firstly, a printing plate was prepared according to the following process.

The original plate was exposed for 10 minutes by an ultraviolet ray exposing device of 8 mW/cm² (light source: 10R manufactured by Philips) arranged at a height of 5 cm from a surface of the photosensitive resin layer so as to subject to cross-linking and curing. Then, a protective film was detached therefrom. A FlexPose ! direct equipped with a 300 W carbon dioxide laser, manufactured by Luescher Flexo was used as the laser-engraving device. Specifications of the device included a laser wavelength of 10.6 μm, a beam diameter of 30 μm, a plate-mounting drum diameter of 300 mm and a processing rate of 1.5 hours/0.5 m². Conditions of the laser-engraving are as follows. Here, (i) to (iii) are conditions inherent to the device. For conditions (iv) to (vii), which may be set arbitrarily, standard conditions of the device were adopted, respectively.

(i) Resolution: 2540 dpi
(ii) Laser pitch: 10 μm
(iii) Number of drum rotations: 982 cm/sec.
(iv) Top power: 9%
(v) Bottom power: 100%
(vi) Shoulder width: 0.30 mm
(vii) Evaluated image: 150 lpi, halftone dots at every 1% from 0 to 100%

After that, printing for 10,000 shots was conducted using the resulting printing plate under such a state wherein an applied pressure corresponds to an extent of 50 μm over compared with an appropriate printing pressure. After finishing the printing for 10,000 shots, the printed matter and the plate were observed under a microscope of 200 magnifications so as to evaluate the printing durability (cracking of the solid part) according to the following judging standards.

oo: There was no defect in the printed matter and there was no crack in the plate as well.

o: Although there was no defect in the printed matter, there were slight cracks in the plate.

Δ: Although no defect was noticed by naked eye in the printed matter, poor quality was noticed by an observation under a microscope of 200 magnifications.

x: Poor quality was noticed in the printed matter by naked eye.

(3) Printing Durability (Partial Lacking of 1% Halftone Dots)

The 1% halftone dots of the plate obtained by the evaluation of (2) were enlarged by a microscope to an extent of 200 fold. The printing durability (partial lacking of the 1% halftone dots) was evaluated according to the following judging standards.

o: No change was noticed in the 1% halftone dots between the stages of before and after the printing.

Δ: After the printing, partial lacking was noticed in less than 20% of the 1% halftone dots.

x: After the printing, partial lacking was noticed in 20% or more of the 1% halftone dots.

Synthesis of (i) Modified Partially-Saponified Polyvinyl Acetate Having Functional Group Introduced Into Side Chain Thereof Synthetic Example Bi-1

Partially saponified polyvinyl acetate manufactured by Nippon Synthetic Chemical Industry ("KL-05"; degree of polymerization: ca. 500; degree of saponification: 80% by mol) was swollen in acetone, and 1.0% by mol of succinic anhydride was added thereto followed by stirring at 60° C. for 6 hours so as to add carboxyl group to a molecular chain. This polymer was washed with acetone so as to remove unreacted succinic anhydride, and dried. This polymer (100 parts) was dissolved in 200 parts of a mixed solvent of ethanol/water (30/70 in a ratio by mass) at 80° C. Glycidyl methacrylate (6 parts) was added thereto so as to introduce a reactive group into the partially saponified polyvinyl acetate. From an analytical result by pontentiometric titration, it was confirmed that the carboxyl group in the polymer reacted with epoxy group in glycidyl methacrylate and that methacryloyl group was introduced into the polymer side chain. In this way, there was obtained a modified partially-saponified polyvinyl acetate Bi-1 having a functional group introduced into the side chain thereof (i.e. the component (i)).

Synthetic Example Bi-2

A polymer wherein methacrylic acid was contained in vinyl acetate in an amount of 1% by mol as a copolymerizing unit was saponified to give an anion-modified polyvinyl acetate having average degree of polymerization of 650 and degree of saponification of 75% by mol. This polymer (100 parts) was dissolved in 200 parts of a mixed solvent of ethanol/water (30/70 in a ratio by mass) at 80° C. Glycidyl methacrylate (6 parts) was added thereto so as to introduce a reactive group into the partially saponified polyvinyl acetate. From an analytical result by pontentiometric titration, it was confirmed that the carboxyl group in the polymer reacted with epoxy group in glycidyl methacrylate and that methacryloyl group was introduced into the polymer side chain. In this way, there was obtained a modified partially-saponified polyvinyl acetate Bi-2 having a functional group introduced into the side chain thereof (i.e. the component (i)).

Synthetic Example Bi-3

Partially saponified polyvinyl acetate manufactured by Nippon Synthetic Chemical Industry ("KL-05"; degree of polymerization: ca. 500; degree of saponification: 80% by mol) (100 parts) was dissolved in 100 parts of water, 15 parts of N-methylol acrylamide was added thereto, 1 part of phosphoric acid was added thereto as an acid catalyst. The resulting mixture was stirred at 100° C. for four hours, and then water was removed therefrom. In this way, there was obtained a modified partially-saponified polyvinyl acetate Bi-3 having a functional group introduced into the side chain thereof (i.e. the component (i)).

Synthesis of (ii) Tertiary Nitrogen Atom-Containing Polyamide

Synthetic Example Bii-1

ε-Caprolactam (521 parts (46.0% by mol)), 458 parts (26.6% by mol) of cyclohexanedicarboxylic acid, 549 parts (27.4% by mol) of 1,4-bis(3-aminopropyl)piperazine, 5 parts of 50% aqueous solution of hypophosphorous acid and 3000 parts of water were charged into an autoclave. After substituting with nitrogen, the autoclave was tightly closed and gradually heated. Starting from a stage when an inner pressure reached 0.4 MPa, water was evaporated therefrom until the pressure could no longer be maintained. The pressure was returned to atmospheric within about 2 hours. Then, a reaction was conducted at an atmospheric pressure for 1 hour. The highest temperature for the polymerization reaction was 255° C. As a result, there was obtained a tertiary nitrogen atom-containing polyamide Bii-1 (i.e. the component (ii)). Composition of the resulting tertiary nitrogen atom-containing polyamide was measured by H-NMR, and it was confirmed that there was no difference between the charged composition and the polymer composition. Composition of this tertiary nitrogen atom-containing polyamide Bii-1 and rates of the structural unit obtained from cyclohexanedicarboxylic acid and of alicyclic structural unit in the polyamide are shown in Table 3.

Synthetic Examples Bii-2 to Bii-7

Synthesis was conducted by the same method as in the case of Synthetic Example Bii-1 except that the types and the compounding rates of diamine and dicarboxylic acid and also the compounding rate of ε-caprolactam were changed so as to result in the polyamide composition mentioned in Table 3. As a result, there was obtained tertiary nitrogen atom-containing polyamides Bii-2 to Bii-7 (i.e. the component (ii)). Composition of the resulting tertiary nitrogen atom-containing polyamide was measured by H-NMR, and it was confirmed that there was no difference between the charged composition and the polymer composition. Compositions of these tertiary nitrogen atom-containing polyamides Bii-2 to Bii-7 and rates of the structural unit obtained from cyclohexanedicarboxylic acid and of alicyclic structural unit in the polyamides are shown in Table 3.

TABLE 3

| Tertiary nitrogen atom-containing polyamide | | | Bii-1 | Bii-2 | Bii-3 | Bii-4 | Bii-5 | Bii-6 | Bii-7 |
|---|---|---|---|---|---|---|---|---|---|
| Polyamide composition (% by mol) | diamine | BAPP | 27.4 | 38.4 | 34.4 | | 30.4 | 40.6 | 34.8 |
| | | AEP | | | | 38.4 | | | 5.4 |
| | | IPDA | | | 10.0 | | | | 10.2 |
| | | HMDA | | | 3.0 | | | | |
| | dicarboxylic acid | adipic acid | | | | | 29.6 | 24.6 | |
| | | CHDA | 26.6 | 37.6 | 46.6 | 37.6 | | 15.2 | 49.6 |
| | ε-caprolactam | | 46.0 | 24.0 | 6.0 | 24.0 | 40.0 | 19.6 | 0.0 |
| Structural unit obtained from cyclohexanedicarboxylic acid in polyamide (% by mol) | | | 26.6 | 37.6 | 46.6 | 37.6 | 0.0 | 15.2 | 49.6 |
| Alicyclic structural unit in polyamide (% by mol) | | | 54.0 | 76.0 | 91.0 | 76.0 | 30.4 | 55.8 | 100.0 |

BAPP: 1,4-bis(3-aminopropyl)piperazine
AEP: N-(2-aminoethyl)piperazine
IPDA: isophoronediamine
HMDA: hexamethylenediamine
CHDA: 1,4-cyclohexanedicarboxylic acid Example B1

The component (i) and the component (ii) shown in Table 4 were added into a three-necked flask equipped with a spatula for stirring and a cooling jacket, and mixed with a mixed solvent consisting of 50 parts of "Solmix" (registered trademark) H-11 (an alcohol mixture manufactured by Japan Alcohol Corporation) and 50 parts of water. The resulting mixture was heated at 90° C. for 2 hours with stirring so as to dissolve the component (i) and the component (ii). After cooling down to 70° C., other components were added followed by stirring for 30 minutes so as to give a photosensitive resin composition.

After that, a support having an adhesive layer was prepared. The support having an adhesive layer was prepared by coating an adhesive composition containing an ultraviolet ray-absorbing material on a polyester film of 250 μm thickness, in a coat thickness of 20 μm. The above photosensitive resin composition was subjected to a flow casting on a surface of the adhesive layer of this support. A polyester film of 125 μm thickness (protective film) was laminated on the photosensitive resin composition thereon whereby a crude plate of a sheet-shaped laminate having a total thickness of 1080 μm was molded. In this crude plate, the photosensitive resin layer of 685 μm thickness is arranged between the support having an adhesive layer and the polyester film of 125 μm thickness (protective film).

After the original plate was stored for 7 days or more, presence or absence of the partial lacking in the image part and printing durability were evaluated. Result of those evaluations is shown in Table 4 together with the compositions of the photosensitive resin compositions of Example B1.

Examples B2 to B13 and Comparative Examples B1 to B5 Photosensitive resin compositions were prepared by the same manner as in Example B1 except that the compositions of the photosensitive resin compositions were changed to those mentioned in Table 4 whereupon printing original plates were obtained. The resulting printing plates were subjected to the same evaluations as in Example B1. Result of those evaluations is shown in Table 4 together with the compositions of the photosensitive resin compositions of Examples B2 to B13 and Comparative Examples B1 to B5.

Details of (iii) photopolymerizable unsaturated compounds (Biii-1 to Biii-5), (iv) photopolymerization initiator, plasticizer and thermal polymerization inhibitor mentioned in Table 4 are as follows.

Biii-1: 4-Acryloylmorpholione (manufactured by KJ Chemicals)

Biii-2: 2-Acryloyloxyethylphthalic acid (HOA-MPL(N) manufactured by Kyoeisha Chemical)

Biii-3: Glycerol dimethacrylate (manufactured by Kyoeisha Chemical)

Biii-4: 2-Hydroxy-3-acryloyloxypropyl methacrylate (NK Ester 701A manufactured by Shin-Nakamura Chemical)

Biii-5: Propylene glycol diepoxyacrylate (Epoxy Ester 70PA manufactured by Kyoeisha Chemical)

Photopolymerization initiator: Benzyl dimethylketal

Plasticizer: Diethylene glycol

Thermal polymerization inhibitor: Hydroquinone monomethyl ether

TABLE 4

| Compositions of photosensitive resin composition (part by mass) | | | Example B1 | Example B2 | Example B3 | Example B4 | Example B5 | Example B6 |
|---|---|---|---|---|---|---|---|---|
| (i) modified partially-saponified polyvinyl acetate having a functional group introduced into side chain thereof | | Bi-1 | 53 | 53 | 53 | 53 | 53 | 53 |
| | | Bi-2 | | | | | | |
| | | Bi-3 | | | | | | |
| (ii) tertiary nitrogen atom-containing polyamide | | Bii-1 | 10 | | | | | |
| | | Bii-2 | | 10 | | | | |
| | | Bii-3 | | | 10 | | | |
| | | Bii-4 | | | | 10 | | |
| | | Bii-5 | | | | | 10 | |
| tertiary nitrogen atom-containing polyamide other than (ii) | | Bii-6 | | | | | | 10 |
| | | Bii-7 | | | | | | |
| (iii) photopolymerizable unsaturated compound | | Biii-1 | 12 | 12 | 12 | 12 | 12 | 12 |
| | | Biii-2 | | | | | | |
| | | Biii-3 | | | | | | |
| | | Biii-4 | 10.8 | 10.8 | 10.8 | 10.8 | 10.8 | 10.8 |
| | | Biii-5 | 5 | 5 | 5 | 5 | 5 | 5 |
| (iv) photopolymerization initiator | | | 1 | 1 | 1 | 1 | 1 | 1 |
| plasticizer | | | 8 | 8 | 8 | 8 | 8 | 8 |
| thermal polymerization inhibitor | | | 0.2 | 0.2 | 0.2 | 0.2 | 0.2 | 0.2 |
| Result of evaluations | resistance to partial lacking by brushing | for fine lines of 30 μm width | ○ | ○ | ○ | ○ | ○ | ○ |
| | | for independent points of 100 μm diameter | ○ | ○ | ○ | ○ | ○ | ○ |
| | printing durability | for cracking of solid part | ○ | ○ | ○ | ○ | ○ | ○ |
| | | for partial lacking of 1% halftone dots | ○ | ○ | ○ | ○ | ○ | ○ |

| Compositions of photosensitive resin composition (part by mass) | | | Example B7 | Example B8 | Example B9 | Example B10 | Example B11 | Example B12 |
|---|---|---|---|---|---|---|---|---|
| (i) modified partially-saponified polyvinyl acetate having a functional group introduced into side chain thereof | | Bi-1 | 53.5 | 50 | 46 | | | 55.5 |
| | | Bi-2 | | | | 53 | | |
| | | Bi-3 | | | | | 53 | |
| (ii) tertiary nitrogen atom-containing polyamide | | Bii-1 | 7.5 | 13 | 17 | 10 | 10 | 7.5 |
| tertiary nitrogen atom-containing polyamide other than (ii) | | | | | | | | |
| (iii) photopolymerizable unsaturated compound | | Biii-1 | 14 | 12 | 12 | 12 | 12 | 12 |
| | | Biii-2 | | | | | | |
| | | Biii-3 | | | | | | |
| | | Biii-4 | 10.8 | 10.8 | 10.8 | 10.8 | 10.8 | 10.8 |
| | | Biii-5 | 5 | 5 | 5 | 5 | 5 | 5 |
| (iv) photopolymerization initiator | | | 1 | 1 | 1 | 1 | 1 | 1 |
| plasticizer | | | 8 | 8 | 8 | 8 | 8 | 8 |
| thermal polymerization inhibitor | | | 0.2 | 0.2 | 0.2 | 0.2 | 0.2 | 0.2 |

TABLE 4-continued

| | | Example B13 | Comparative Example B1 | Comparative Example B2 | Comparative Example B3 | Comparative Example B4 | Comparative Example B5 |
|---|---|---|---|---|---|---|---|
| Result of evaluations | resistance to partial lacking by brushing | for fine lines of 30 μm width | ○ | ○ | ○ | ○ | ○ | ○ |
| | | for independent points of 100 μm diameter | ○ | ○ | ○ | ○ | ○ | ○ |
| | printing durability | for cracking of solid part | ○ | ○ | ○ | ○ | ○ | ○ |
| | | for partial lacking of 1% halftone dots | ○ | ○ | ○ | ○ | ○ | ○ |
| Compositions of photosensitive resin composition (part by mass) | (i) modified partially-saponified polyvinyl acetate having a functional group introduced into side chain thereof | Bi-1 | 46 | 61 | 55.5 | 46 | 53 | 53 |
| | | Bi-2 | | | | | | |
| | | Bi-3 | | | | | | |
| | (ii) tertiary nitrogen atom-containing polyamide | Bii-1 | | | | | | |
| | | Bii-2 | | | | | | |
| | | Bii-3 | 17 | | | | | |
| | | Bii-4 | | | | | | |
| | | Bii-5 | | | 7.5 | | | |
| | | Bii-6 | | | | 17 | | |
| | | Bii-7 | | | | | | |
| | tertiary nitrogen atom-containing polyamide other than (ii) | | | | | | 10 | 10 |
| | (iii) photopolymerizable unsaturated compound | Biii-1 | 12 | 14 | 12 | 12 | 12 | 12 |
| | | Biii-2 | | | | | | |
| | | Biii-3 | | | | | | |
| | | Biii-4 | 10.8 | 10.8 | 10.8 | 10.8 | 10.8 | 10.8 |
| | | Biii-5 | 5 | 5 | 5 | 5 | 5 | 5 |
| | (iv) photopolymerization initiator | | 1 | 1 | 1 | 1 | 1 | 1 |
| | plasticizer | | 8 | 8 | 8 | 8 | 8 | 8 |
| | thermal polymerization inhibitor | | 0.2 | 0.2 | 0.2 | 0.2 | 0.2 | 0.2 |
| Result of evaluations | resistance to partial lacking by brushing | for fine lines of 30 μm width | ○ | x | x | x | △ | △ |
| | | for independent points of 100 μm diameter | ○ | x | x | x | △ | △ |
| | printing durability | for cracking of solid part | ○ | ○ | ○ | ○ | ○ | ○ |
| | | for partial lacking of 1% halftone dots | ○ | ○ | ○ | ○ | ○ | ○ |

As will be noticed from Table 4, in Examples B1 to B13, a tertiary nitrogen atom-containing polyamide containing a structural unit obtained from cyclohexanedicarboxylic acid and an alicyclic structural unit within a range of the present invention (20 to 50% by mol and 50 to 95% by mol, respectively) is used as a tertiary nitrogen atom-containing polyamide. Therefore, in Examples B1 to B13, the products are excellent in all terms of the resistance to partial lacking by brushing and the printing durability. On the contrary, the resistance to partial lacking by brushing and the printing durability are inferior when no tertiary nitrogen atom-containing polyamide is contained therein as shown in Comparative Example B1. As shown in Comparative Examples B2 and B3, when a tertiary nitrogen atom-containing polyamide which does not contain any structural unit obtained from cyclohexanedicarboxylic acid is used, the resistance to partial lacking by brushing is inferior. As shown in Comparative Example B4, even if the structural unit obtained from cyclohexanedicarboxylic acid is contained therein, the resistance to partial lacking by brushing is inferior when a content of the unit is too small. As shown in Comparative Example B5, even if the structural unit obtained from cyclohexanedicarboxylic acid is contained therein in an amount within the range of the present invention, the printing durability is inferior when a total amount of the alicyclic structural unit is too large.

INDUSTRIAL APPLICABILITY

In accordance with the photosensitive resin composition for a relief printing original plate of the present invention, it is possible to achieve, for an analog plate, high level of image reproducibility in terms of highlight halftone dots while maintaining the printing durability and to prevent increase in stickiness of the printing plate surface even if a compounding rate of tertiary nitrogen atom-containing polyamide is increased; and it is possible to achieve, for a laser-engraving plate, small decrease in the image reproducibility even when the washing step after the laser-engraving is conducted by a brush while maintaining excellent printing durability during printing. Accordingly, the present invention is very useful.

The invention claimed is:

1. A photosensitive resin composition for a relief printing original plate containing (i) modified partially-saponified polyvinyl acetate having a functional group introduced into a side chain thereof, (ii) tertiary nitrogen atom-containing polyamide, (iii) a photopolymerizable unsaturated compound and (iv) a photopolymerization initiator, characterized in that the above (ii) tertiary nitrogen atom-containing polyamide contains 20 to 50% by mol of a structural unit obtained from cyclohexane-dicarboxylic acid and 50 to 95% by mol of an alicyclic structural unit in total, in relation to a total of an amount of an aminocarboxylic acid unit (including a case wherein lactam is a raw material), an amount of a dicarboxylic acid unit and an amount of a diamine unit in the polyamide molecule.

2. The photosensitive resin composition for a relief printing original plate according to claim 1, wherein an amount of (i) modified partially-saponified polyvinyl acetate having a functional group introduced into a side chain thereof, an amount of (ii) tertiary nitrogen atom-containing polyamide, an amount of (iii) photopolymerizable unsaturated compound and an amount of (iv) photopolymerization initiator used in the photosensitive resin composition for a relief printing original plate are 30 to 65% by mass, 5 to 30% by mass, 5 to 35% by mass and 0.1 to 5% by mass, respectively.

3. The photosensitive resin composition for a relief printing original plate according to claim 1, wherein the above (ii) tertiary nitrogen atom-containing polyamide is a polyamide which contains a piperazine ring in a molecule.

4. The photosensitive resin composition for a relief printing original plate according to claim 1, wherein the above (i) modified partially-saponified polyvinyl acetate having a functional group introduced into a side chain thereof contains an ester bond and the functional group in the side chain, and wherein the functional group is a photopolymerizable unsaturated group and/or a carboxyl group.

5. The photosensitive resin composition for a relief printing original plate according to claim 1, wherein the above (iii) photopolymerizable unsaturated compound contains a photopolymerizable unsaturated compound containing a heterocyclic ring having a 5 to 7-membered ring.

6. A relief printing original plate which is characterized in having, on a support, a photosensitive resin layer formed by using the photosensitive resin composition for a relief printing original plate mentioned in claim 1.

7. The relief printing original plate according to claim 6, wherein the relief printing original plate is a relief printing original plate of an analog type.

8. The relief printing original plate according to claim 6, wherein the relief printing original plate is a relief printing original plate of a laser-engraving type.

* * * * *